US008823118B2

(12) United States Patent
Horng et al.

(10) Patent No.: US 8,823,118 B2
(45) Date of Patent: Sep. 2, 2014

(54) SPIN TORQUE TRANSFER MAGNETIC TUNNEL JUNCTION FABRICATED WITH A COMPOSITE TUNNELING BARRIER LAYER (75) Inventors: Cheng T Horng, San Jose, CA (US); Ru-Ying Tong, Los Gatos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 3 days.

(21) Appl. No.: 13/344,292

(22) Filed: Jan. 5, 2012

(65) Prior Publication Data
US 2013/0175644 A1    Jul. 11, 2013

(51) Int. Cl.
*H01L 29/82*    (2006.01)
*H01L 21/8246*    (2006.01)
*B82Y 99/00*    (2011.01)

(52) U.S. Cl.
USPC ............ 257/421; 257/E29.323; 257/E21.665; 977/943

(58) Field of Classification Search
USPC ......................................... 257/421
See application file for complete search history.

(56) References Cited

U.S. PATENT DOCUMENTS

| | | | |
|---|---|---|---|
| 7,948,044 B2 | 5/2011 | Horng et al. | |
| 7,981,697 B2 | 7/2011 | Wang | |
| 7,994,597 B2 | 8/2011 | Min | |
| 2005/0062033 A1* | 3/2005 | Ichihara et al. | 257/17 |
| 2006/0018057 A1 | 1/2006 | Huai | |
| 2006/0068196 A1* | 3/2006 | Suenaga et al. | 428/328 |
| 2006/0141640 A1 | 6/2006 | Huai et al. | |
| 2007/0085068 A1 | 4/2007 | Apalkov et al. | |
| 2007/0269681 A1* | 11/2007 | Aiga et al. | 428/692.1 |
| 2008/0061388 A1* | 3/2008 | Diao et al. | 257/421 |
| 2008/0217710 A1 | 9/2008 | Horng et al. | |
| 2010/0078310 A1 | 4/2010 | Tsunekawa et al. | |
| 2010/0315863 A1 | 12/2010 | Zhu et al. | |
| 2012/0135273 A1* | 5/2012 | Horng et al. | 428/828.1 |

OTHER PUBLICATIONS

PCT Search Report PCT/US2012/070323 Maile date—Feb. 19, 2013.
"Current-driven excitation of magnetic multilayers," by J.C. Slonczewski, Journal of Magnetism and Magnetic Materials 159 (1996) L1-L7, Elsevier.
"Estimation of spin transfer torque effect and thermal activation effect on magnetization reversal in CoFeB/MgO/CoFeB magnetoresistive tunneling junctions," by Masatoshi Yoshikawa et al., Journal of Applied Physics 101. 09A511 (2007), American Institute of Physics, pp. 1-3.

(Continued)

*Primary Examiner* — Zandra Smith
*Assistant Examiner* — Lawrence Tynes, Jr.
(74) *Attorney, Agent, or Firm* — Saile Ackerman LLC; Stephen B. Ackerman (57) ABSTRACT A STT-RAM MTJ is disclosed with a composite tunnel barrier comprised of a CoMgO layer that contacts a pinned layer and a MgO layer which contacts a free layer. A CoMg layer with a Co content between 20 and 40 atomic % is deposited on the pinned layer and is then oxidized to produce Co nanoconstrictions within a MgO insulator matrix. The nanoconstrictions control electromigration of Co into an adjoining MgO layer. The free layer may comprise a nanocurrent channel (NCC) layer such as FeSiO or a moment dilution layer such as Ta between two ferromagnetic layers. Furthermore, a second CoMgO layer or a CoMgO/MgO composite may serve as a perpendicular Hk enhancing layer formed between the free layer and a cap layer. One or both of the pinned layer and free layer may exhibit in-plane anisotropy or perpendicular magnetic anisotropy.

12 Claims, 6 Drawing Sheets

(56) References Cited

OTHER PUBLICATIONS

"Reducing the critical current for spin-transfer switching of perpendicularly magnetized nanomagnets," by S. Mangin et al., Applied Physics Letters 94. 012502 (2009), American Institute of Physics, pp. 1-3.

"Comparison of Scaling of In-Plane and Perpendicular Spin Transfer Switching Technologies by Micromagnetic Simulation," by Dmytro Apalkov et al., IEEE Transactions on Magnetics, vol. 46, No. 6, Jun. 2010, pp. 2240-2243.

Electromigration in thin tunnel junctions with ferromagnetic/non-magnetic electrodes: Nanoconstrictions, local heating, and direct and wind forces, by J. Ventura et al., Physcial Review B 72, 094432 (2005), pp. 1-7.

"Spin injection in thermally assisted magnetic random access memory," by James G. Deak, Journal of Applied Physics 97, 10E316 (2005) pp. 1-3.

"Fabrication of high-magnetoresistance tunnel junctions using Co75Fe25 ferromagnetic electrodes," by Xiu-Feng Han et al., Applied Physics Letters, vol. 77, No. 2, Jul. 10, 2000, pp. 283-285.

"Thermally Assisted Switching in Exchange-Biased Storage Layer Magnetic Tunnel Juncitons," by I. L. Prejbeanu et al., IEEE Transactions on Magnetics, vol. 40, No. 4, Jul. 2004, pp. 2625-2627.

"Tunneling giant magnetoresistance in heterogeneous Fe-SiO2 granular films," by S. Honda et al., Physical Review B, vol. 56, No. 22, Dec. 1, 1997-II, pp. 566-573.

"Current driven resistanace changes in low resistance x area magnetic tunnel junctions with ultra-thin Al-Ox barriers," by A. Deac et al., Journal of Applied Physics, vol. 95, No. 11, Jun. 1, 2004, pp. 6792-6794.

"Characterization of growth and crystallization processes in CoFeB/MgO/CoFeB magnetic tunnel junction structure by reflective high-energy electron diffraction," by Shinji Yuasa et al., Applied Physics Letters 87. 242503 (2005), pp. 1-3.

Co-pending U.S. Appl. No. 12/927,939, filed Nov. 30, 2010, "Structure and Method for Enhancing Interfacial Perpendicular Anisotropy in CoFe(B)/MgP/CoFe(B) Magnetic Tunnel Junctions," assigned to the same assignee as the present invention, 43 pgs.

Co-pending U.S. Appl. No. 12/931,866, filed Feb. 11, 2011, "Magnetic Element With Improved Out-of-Plane Anisotropy for Spintronic Applications," assigned to the same assignee as the present invention, 36 pgs.

Co-pending U.S. Appl. No. 13/068,172, filed May 4, 2011, "Multilayers Having Reduced Perpendicular Demagnetizing Field Using Moment Dilution for Spintronic Applications," assigned to the same assignee as the present invention, 41 pgs.

\* cited by examiner

| Element | Oxide | Free energy of formation per mol of $O_2$ ($\times 10^{-6}$ J.kmol$^{-1}$) |
|---|---|---|
| Au | $Au_2O_3$ | 109 |
| Ag | $Ag_2O_3$ | −7 |
| Ru | $RuO_2$ | −253 |
| Cu | CuO | −254 |
| Co | CoO | −426 |
| Ni | NiO | −432 |
| Fe | FeO | −488 |
| Fe | $Fe_2O_3$ | −495 |
| Mo | $MoO_2$ | −502 |
| W | $WO_3$ | −509 |
| Sn | SnO | −514 |
| Zn | ZnO | −636 |
| Cr | $Cr_2O_3$ | −699 |
| Nb | $Nb_2O_5$ | −708 |
| Ta | $Ta_2O_5$ | −788 |
| B | $B_2O_3$ | −796 |
| Si | $SiO_2$ | −805 |
| Mn | $Mn_2O_3$ | −854 |
| Ti | $TiO_2$ | −890 |
| Zr | $ZrO_2$ | −1037 |
| Al | $Al_2O_3$ | −1053 |
| Ba | BaO | −1056 |
| Hf | $HfO_2$ | −1084 |
| Mg | MgO | −1146 |
| Ca | CaO | −1208 |

SPIN TORQUE TRANSFER MAGNETIC TUNNEL JUNCTION FABRICATED WITH A COMPOSITE TUNNELING BARRIER LAYER

RELATED PATENT APPLICATIONS

This application is related to the following: Ser. No. 12/927,939, filing date Nov. 30, 2010, Ser. No. 12/931,866, filing date Feb. 11, 2011; and Ser. No. 13/068,172, filing date May 4, 2011; assigned to a common assignee and herein incorporated by reference in their entirety.

FIELD OF THE INVENTION

The invention relates to a high performance Magnetic Tunneling Junction (MTJ) element and a method for making the same, and in particular, to a spin transfer torque (STT-RAM) device that achieves low switching current and high dR/R by incorporating a composite tunnel barrier layer between a pinned layer and a free layer.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-RAM on a gigabit scale.

Figure 1:
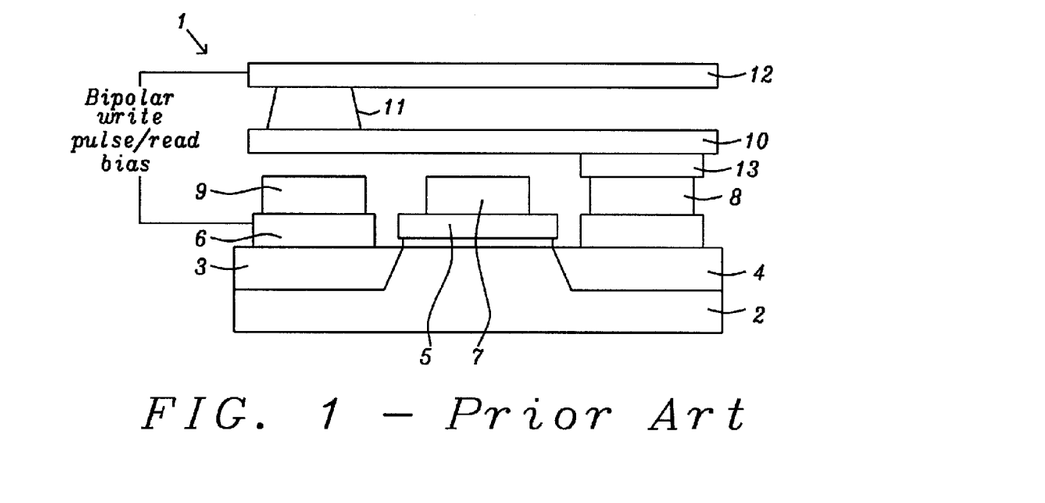
FIG. 1 is a cross-sectional view showing a memory cell in a conventional STT-RAM device.

As shown in FIG. 1, one example of a memory cell in a STT-RAM 1 includes a gate 5 formed above a p-type semiconductor substrate 2, a source 3, drain 4, word line (WL) 7 above the gate, and a source line 9. There is also a bottom electrode (BE) 10 formed above the source line 9 and word line 7, and a MTJ cell 11 between the BE and bit line (BL) 12. There is a Cu stud 6 connecting the source 3 to BL 12, and a via 13 and Cu stud 8 to connect BE 10 to drain 4. A transistor source 3 and drain 4 are connected to the MTJ 11 so that DC current may flow across the MTJ.

Both field-MRAM and STT-RAM have a MTJ element based on a tunneling magneto-resistance (TMR) effect wherein a stack of layers has a configuration in which two ferromagnetic layers are separated by a thin non-magnetic dielectric layer. The MTJ element is typically formed between a bottom electrode such as a first conductive line and a top electrode which is a second conductive line at locations where the top electrode crosses over the bottom electrode.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-RAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-RAM and a conventional MRAM is only in the write operation mechanism. The read mechanism is the same.

For STT-RAM to be viable in the 90 nm technology node and beyond, the ultra-small MTJs (also referred to as nanopillars or nanomagnets herein) must exhibit a magnetoresistive (MR) ratio that is much higher than in a conventional MRAM-MTJ which uses AlOx as the tunnel barrier and a NiFe free layer. Furthermore, the critical current density (Jc) must be lower than about $10^6$ A/cm² to be driven by a CMOS transistor that can typically deliver 100 µA per 100 nm gate width. A critical current for spin transfer switching (Ic), which is defined as $[(Ic^+ + Ic^-)/2]$, for the present 180 nm node sub-micron MTJ having a top-down oval shaped area of about 0.2×0.4 micron, is generally a few milliamperes. The critical current density (Jc), for example (Ic/A), is on the order of several $10^7$ A/cm². This high current density, which is required to induce the spin-transfer effect, could destroy a thin tunnel barrier made of AlOx, MgO, or the like. Thus, for high density devices such as STT-RAM on a gigabit scale, it is desirable to decrease Ic (and its Jc) by approximately an order of magnitude so as to avoid an electrical breakdown of the MTJ device and to be compatible with the underlying CMOS transistor that is used to provide switching current and to select a memory cell.

Under a macrospin model, the critical switching current density Jc at zero temperature is expected to have the form:

$$Jc \sim 2e\alpha Mst(Ha+Hk+Hdip-4\pi Ms)/\hbar\eta = 2e \, \alpha Mst(\text{Heff})/\hbar\eta \quad (1)$$

where e is the electron charge, α is a Gilbert damping constant, Ms and t are the magnetization and thickness of the free layer, $\hbar$ is the reduced Plank's constant, η is the spin-transfer efficiency which is related to the spin polarization (P), Ha is the external applied field along the easy axis, Hk is the effective anisotropy field including magnetocrystalline anisotropy and shape anisotropy (in an in-plane magnetized bit, Hk is dominated by shape anisotropy), Hdip is the dipolar field from the reference layer, and 4π Ms arises from the demagnetization field of the thin film geometry. In a MTJ structure (F/I/F) where F is a ferromagnetic layer and I is an insulator layer, when the spin relaxation distance is much larger than the ferromagnetic film thickness, the spin continuity holds true, i.e., the sum of interfacial torques from both left and right sides equals the net inflow of spin current. As the magnetization is fixed on one side, the other side magnetization will experience an in-plane torque of $T=-(\hbar P_L J_0/2e)\sin(\theta)$ where e is the electron charge, $P_L$ is tunneling polarization parameter, $J_0$ is electric current density, and θ is the angle between the magnetizations on the two sides of the tunnel barrier (insulator). Thus, spin transfer efficiency is a function of current polarity, polarization P, and the relative angle θ between the free and pinned layer as represented in the following equation: $\eta(\theta)=P/[2(1+P^2 \cos\theta)]$ At a finite temperature, thermal agitation plays an important role in reducing the switching current at long current pulses (>10 ns) according to M. Yoshikawa et al. in "Estimation of spin transfer torque effect and thermal activation effect on magnetization reversal in CoFeB/MgO/CoFeB magnetoresistive tunneling junctions", J. Appl. Phys. 101, 09A511 (2007). In this thermal activated switching regime, the switching current is dependent on the current pulse width τ and thermal stability factor Δ=Eb/$k_B$T, where Eb=MsVHk/2 which is independent of the demagnetization field 4πMs. For an in-plane magnetized bit, demagnetization field 4πMs (several thousand Oersted) is much greater than Ha and shape anisotropy Hk, and dipole field Hdip (hundred Oersted). Therefore, the value of Heff=4πMs restricts efforts to reduce Jc. For an out-of-plane bit, the easy axis is perpendicular to the film plane thereof and Heff=Hk⊥−4πMs.

Magnetization switching behavior at positive and negative biases in STT switching is related to the following: (a) the STT effect; (b) the thermal activation effect due to the Joule heating; and (c) the magnetic excitation effect due to the hot electron. Dynamic behavior of a STT-MTJ depends highly on thermal fluctuation within the device which means a temperature increase within the free layer will play an important role in assisting the switching process.

Within the assumption of equation (1), low critical currents while maintaining thermal stability can be achieved by a perpendicularly magnetized nanomagnet as described by S. Magnin et al. in "Reducing the critical current for spin-transfer switching of perpendicularly magnetized nanomagnet", APL 94, 012502 (2009). Furthermore, spin transfer torque memory has been investigated for in-plane and perpendicular technologies by micromagnetic simulation by D. Apalka et al in "Comparison of scaling of in-plane and perpendicular spin transfer switching technologies by micromagnetic simulation", IEEE Trans. Magn. 46, 2240 (2010). There is data to show that in-plane technology has excellent scalability down to the 20 nm width of the cell whereas perpendicular technology has a switching current which is substantially independent of pulse width τ, and a switching voltage that increases rapidly at smaller nodes, thereby requiring significant efforts to design new high polarization and low damping materials.

Ventura et al. in "Electromigration in thin tunnel junctions with ferromagnetic/nonmagnetic electrode: Nanoconstrictions, local heating, and direct wind force", Phys. Rev. B 72, 094432 (2005) describes how current induced resistance changes were investigated in magnetic tunnel junctions with an ultra-thin AlOx (Al6+ oxidation) barrier. Resistance versus current (R–I) curves exhibited reversible resistance changes that reached over 100%. Note that MTJs with thicker AlOx (Al8+ oxidation) barriers and $Co_{75}Fe_{25}$ ferromagnetic layers yield TMR<60% according to X. Han et al. "High magnetoresistance tunnel junctions using $Co_{75}Fe_{25}$ ferromagnetic electrode", Japan J. Apply. Phys. 39, L439 (2000). Ventura attributes high resistance changes to controlled electromigration in a local nanoconstriction (area of reduced thickness, hot spot) of the ultra-thin barrier. Electromigration force acts in the direction of the electron flow (wind force) due to the transfer of momentum from electrons to the migrating ions (similar to spin-transfer torque to move a domain wall).

In STT-RAM devices, spin polarized current is used for switching free layer magnetization. I. Prejbeanu et al. in "Thermally assisted switching in exchange-biased storage layer magnetic tunnel junctions" IEEE Trans. Magn. 40, 2625 (2004), and J. Deak in "Spin injection in thermally assisted magnetic random access memory", J. Appl. Phys. 97, 10E316 (2005) state that device temperature in a CoFe(B)/MgO/CoFeB nanomagnet during spin transfer torque switching can be as high as 200° C. (500° K). In the NCC (nanocurrent channel) MTJ nanomagnet, the spin current passes only through the nano-conducting channels thereby generating a great amount of Joule heating (up to 10× of the Jc). It is estimated that the device temperature in spin transfer torque switching can be as high as 300° C.

For STT-RAM applications, the ultra small MTJ element hereafter referred to as a nanomagnet must exhibit a high tunneling magnetoresistive ratio (MR or dR/R) at low resistance×area (RA) values of less than 20 ohm-μm². Note that dR is the maximum change in resistance in a MTJ and R is the minimum resistance of the MTJ. In U.S. Pat. No. 7,948,044, a nanocurrent channel (NCC) layer is employed to minimize Jc while achieving a high dR/R value and is made of Fe(Si) or Co(Si) grains in a silicon oxide or silicon nitride matrix. The tunnel barrier layer is a single layer of MgO. U.S. Pat. No. 7,981,697 describes an expanded list of materials used in a NCC layer that includes oxides made of Ti, Hf, Ta, in addition to the standard silicon oxide. A single MgO layer serves as the tunnel barrier.

In U.S. Pat. No. 7,994,597, a coupling valve layer is formed within a free layer and comprises a plurality of magnetic nano-conducting channels in an insulator material. A single tunnel barrier layer is shown between a fixed layer and the composite free layer.

To our knowledge, the prior art does not teach a composite tunnel barrier layer to provide a MTJ that has a thermal stability factor of at least 65, a write voltage (VW)<400 mV, and a TMR (MR ratio)≥100% to satisfy STT-RAM requirements. Thus, it is essential to develop a MTJ where all of a high MR ratio, low RA and VW, thermal stability factor≥65, and a current driven switching capability required for high performance STT-RAM devices are achievable.

SUMMARY OF THE INVENTION

One objective of the present invention is to provide a MTJ element that is able to satisfy design requirements for advanced devices including a 64 Mb STT-MRAM wherein the thermal stability factor A is greater than 65, MR ratio is at least 100%, and VW is <400 mV.

A second objective of the present invention is to provide a MTJ with flexibility to include a free layer with one or both of in-plane magnetization and perpendicular magnetic anisotropy (PMA) wherein the free layer may be a single layer, a composite with a synthetic anti-parallel (SyAP) configuration, a nanocurrent channel (NCC) configuration, or having a moment diluting layer within a free layer that contacts a perpendicular Hk enhancing layer.

According to one embodiment, these objectives are achieved by providing a substrate comprised of a bottom conductor electrode (BE) on which a spin-transfer (STT)-RAM structure is fabricated. The BE is typically a composite and preferably has an uppermost Ta layer that is sputter etched to form an amorphous surface to promote smooth and flat overlying layers in the MTJ. Thereafter, a MTJ stack of layers is deposited on the BE. In one aspect, the MTJ stack has a bottom spin valve configuration in which a seed layer, AFM layer, pinned layer, composite tunnel barrier layer, free layer, and a capping layer are sequentially formed on the BE. The seed layer is preferably NiCr and the AFM layer may be comprised of MnPt or IrMn, for example. The pinned layer may have an AP2/Ru/AP1 configuration where the AP2 magnetic layer contacts the AFM layer and the AP1 magnetic layer contacts the tunnel barrier layer. The AP1 layer may be comprised of CoFe, CoFeB, or a combination thereof.

A key feature is a tunnel barrier layer which includes at least a Co—MgO layer and a MgO layer wherein the Co—MgO layer (also referred to as CoMgO) is described to mean Co grains that are distributed in a MgO insulator matrix. The Co grains are formed in columns and represent nanoconstrictions for conducting current and thereby serve to control electromigration of Co in the CoMgO layer into the adjoining MgO layer. Preferably, the CoMgO layer is formed before the MgO layer in a bottom spin valve configuration, and CoMgO is formed after the MgO layer in a top spin valve such that the MgO portion of the composite tunnel barrier contacts the free layer.

The free layer may be a single layer made of CoFeB or the like, a synthetic anti-parallel coupled (SyAP) layer, or may be comprised of a nanocurrent channel (NCC) layer formed between a lower magnetic FL1 layer contacting the tunnel barrier and an upper magnetic FL2 layer. The aforementioned free layer configurations have substantially in-plane magnetic anisotropy. The NCC layer has magnetic and electrically conductive RM grains formed within an insulator matrix represented by RMO, RMN, or RMON where R is Fe, Co, Ni, or an alloy thereof, and the metal (M) is Si, Al, or another element that is capable of forming oxides, nitrides, or oxynitrides. Preferably, the NCC layer thickness is essentially the same value in Angstroms as the minimum RM grain size which for Fe(Si) is about 10 Angstroms in a $FeSiO_2$ NCC layer.

In another embodiment, the free layer may have a moment diluting layer such as Ta formed between a FL1 magnetic layer and a ferromagnetic FL3 layer having perpendicular magnetic anisotropy (PMA) that is established by an interface with an overlying Hk enhancing layer such as CoMgO or CoMgO/MgO. The free layer may have a CoFeB/Ta/CoFeB configuration wherein both of the FL1 and FL3 layers are CoFeB and have PMA. In an alternative embodiment, the FL3 layer is a composite with a CoFeB/Co configuration where the upper Co layer interfaces with an overlying CoMgO perpendicular Hk enhancing layer. In this case, the tunnel barrier layer may be a single layer of MgO or a composite with a CoMgO/MgO configuration as mentioned in previous embodiments. Furthermore, the pinned layer may have a PMA character established with a configuration such as $[Ni/Co]_n$/Ta/CoFeB where thin Ni and Co layers are formed in alternating fashion in a laminate where n is the number of laminations, and Ta serves as a moment diluting layer. In this case, an AFM layer is not necessary and the MTJ stack may be represented by seed layer/pinned layer/tunnel barrier/free layer/perpendicular Hk enhancing layer/cap layer where the free layer is CoFeB/Ta/CoFeB as mentioned above.

All layers in the MTJ stack may be formed by sputtering or ion beam deposition (IBD). FL1, FL2, and FL3 layers made of CoFeB or the like are preferably deposited with a low pressure sputtering process for optimum performance. Furthermore, a hard mask may be formed on the cap layer and function as the uppermost layer in the MTJ to protect underlying layers from subsequent process steps including etching and chemical mechanical polish processes. Once all the layers in the MTJ stack are laid down, a thermal anneal process may be employed to fix the pinned layer magnetization (easy-axis) direction. The bottom electrode may be patterned simultaneously with the MTJ such that a common sidewall is formed along the sides of all MTJ layers and along the side of the BE to enable higher pattern density.

BRIEF DESCRIPTION OF THE DRAWINGS

FIGS. 12 (a) and (b) are hysteresis plots showing the effect of a continuous MgO cap layer and discontinuous CoMgO cap layer, respectively, on perpendicular magnetic anisotropy in an adjoining free layer in a MTJ structure.

DETAILED DESCRIPTION OF THE INVENTION

The present invention is a MTJ structure also referred to as a nanopillar or nanomagnet that provides low $J_{CO}$ and high thermal stability to enable enhanced performance for high density advanced STT-RAM devices. The present invention also includes a method of forming a MTJ element for an ultra high density STT-RAM device. Although the exemplary embodiments depict bottom spin valve configurations and one top spin valve structure, the present invention also encompasses a dual spin valve design as appreciated by those skilled in the art. A "top view" as described herein is defined as a viewpoint from a position above the plane of the substrate in the STT-RAM device. Note that the thicknesses for the CoFe and CoFeB magnetic layers, perpendicular Hk enhancing layer, and NCC layers described in various embodiments are based on a MagIC measurement scale and are thinner than determined by a HR-TEM (high resolution-transmission electron microscopy) measurement. In general, a conversion factor of 1.3 is applied which means a 10 Angstrom thick layer, for example, in the present invention is equivalent to a 13 Angstrom thickness based on a HR-TEM measurement used in the industry. NCC layers may also be referred to as nano-conducting channel layers.

During our previous work with NCC-MTJ nanomagnets as described in related patent application Ser. No. 12/927,939, we employed a composite CoFeB(FL1)/NCC/CoFeB (FL2) free layer where FL1 is a first ferromagnetic layer contacting the MgO tunnel barrier, FL2 is a second ferromagnetic layer, and NCC is a nanocurrent channel layer that is formed by RF sputtering of a $Fe$—$SiO_2$ or $Co$—$Al_2O_3$ target. In a NCC-MTJ nanomagnet, the spin current passes only through the nano-conducting channels thereby generating a great amount of Joule heating (about 10× of the Jc). NCC insertion into a CoFeB free layer also induces a significant amount of Hk⊥ (interfacial) which cancels a large portion of the demagnetizing field and helps to reduce switching current density. Compared with a non-NCC MTJ having a single CoFeB free layer, there is a threefold reduction of Jc by inserting a NCC layer within a CoFeB free layer.

Non-NCC MTJ and NCC MTJ structures have been implemented in our Arachne (4 Kbit array) and Cyclone (1 Mb array) lots. Table 1 shows measurements taken by B—H looper and current-in-plane tunneling (CIPT) methods on full film stacks. Prior to formation of a MgO tunnel barrier, an oxygen surfactant layer (OSL) is formed on the pinned layer by a well known method. MgO (NOX) tunnel barriers were prepared by initially depositing a 6 Angstrom thick Mg layer followed by natural oxidation (NOX) with 18 sccm $O_2$ for 450 seconds, and then depositing a 3 Angstrom thick Mg layer followed by a NOX process comprising 1 sccm $O_2$ for 30 seconds before finally depositing a second 3 Angstrom thick Mg layer. MgO (ROX) tunnel barriers were prepared by initially depositing an 8 Angstrom thick Mg layer followed by applying a RF power of 800 W with 0.6 standard liters per minute (slm) of $O_2$ for 6 seconds before finally depositing a 4 Angstrom thick Mg layer. In all cases, the free layer is made of $Co_{20}Fe_{60}B_{20}$ or has a $Co_{20}Fe_{60}B_{20}/NCC/Co_{20}Fe_{50}B_{20}$ configuration and the MTJ stack is annealed with an applied field of 10000 Oe for 1 hour at 330° C. The thickness of each layer is shown after the composition of the layer.

TABLE 1

Magnetic Properties of MTJ with NiCr45/MnPt150/$Co_{75}Fe_{25}$30/Ru7.5/AP1 pinned layer/MgO/free layer/Ru30/Ta30/Ru30 configuration on a bottom electrode (BE)

| AP1 Pinned Layer | MgO | Free Layer | RA | MR | BS | Hc | He | Hk |
|---|---|---|---|---|---|---|---|---|
| $Co_{60}Fe_{20}B_{20}$14/$Co_{75}Fe_{25}$6 (Row 1) | NOX | CoFeB19.5 | 3.2 | 129 | 0.61 | 5.6 | 55.2 | 43.0 |
| $Co_{60}Fe_{20}B_{20}$14/$Co_{75}Fe_{25}$6 (Row 2) | ROX | CoFeB22 | 4.3 | 150 | 0.71 | 7.1 | 26.7 | 34.5 |
| $Co_{60}Fe_{20}B_{20}$14/Co6 (Row 3) | ROX | CoFeB22 | 3.5 | 155 | 0.70 | 5.7 | 41.1 | 39.8 |
| $Co_{60}Fe_{20}B_{20}$14/$Co_{75}Fe_{25}$6 (Row 4) | NOX | CoFeB15.5/Fe20%—$SiO_2$ 7/CoFeB10 | 5.4 | 121 | 0.70 | 9.9 | 38.4 | 39.9 |
| $Co_{60}Fe_{20}B_{20}$14/$Co_{75}Fe_{25}$6 (Row 5) | NOX | CoFeB15.5/Co15%—$Al_2O_3$ 7/CoFeB10 | 6.0 | 131 | 0.74 | 13.2 | 35.8 | 41.9 |
| $Co_{60}Fe_{20}B_{20}$14/$Co_{75}Fe_{25}$6 (Row 6) | ROX | CoFeB15.5/Co15%—$Al_2O_3$ 7/CoFeB10 | 6.7 | 128 | 0.68 | 13.4 | 19.3 | 35.4 |

A comparison of rows 1 and 2 for the non-NCC MTJs reveals that a NOX process for making the MgO tunnel barrier results in a slightly lower RA than a ROX process (3.2 vs. 4.3 ohm-$um^2$) which means the ROX method provides a more uniform/thorough oxidation. In terms of soft breakdown (SBD) percent that is responsible for a low MR (distribution) tail, we have found that MgO(ROX) has reduced the low MR tail to a ppm level (not shown) that is required for MRAM applications. Row 3 compared with row 2 indicates that when the AP1 portion of the pinned layer is made of CoFeB/Co, a lower RA value is achieved than with a CoFeB/CoFe AP1 layer. We believe this RA reduction means that the CoFe layer interface with the MgO layer is slightly oxidized while a Co interface is more inert to oxidation. To minimize CoFe or CoFeB oxidation of the AP1 pinned layer in current devices, we have employed a process whereby a 4 Angstrom thick Mg layer is deposited on the AP1 layer before a MgO layer is RF sputter deposited on the Mg layer.

A comparison of NCC-MTJs in rows 4 and 5 with row 1 shows that NCC insertion into the CoFeB free layer increases RA by a factor of >1.5 and demonstrates that a NCC layer (either Fe—$SiO_2$ or Co—$Al_2O_3$) contributes additional RA. However, MR is only slightly reduced in row 4 and remains unchanged in row 5 (vs. row 1). In our 90 nm node technology, the process of record (POR) nanomagnet size is 55 nm×210 nm. Nanomagnets fabricated with NCC MTJs in rows 4 and 5 yield a MR of around 80%-90% which is a reduction with regard to the MR values of full film stacks in Table 1. Hc(mean) for non-NCC MTJ nanomagnet devices is around 100 Oe. On the other hand, Hc(mean) for row 4-5 NCC MTJ nanomagnet devices is greater than 160 Oe objective which is required for 64 Mbit STT-RAM technology. Furthermore, a thermal stability factor $\Delta=40$ for non-NCC MTJ nanomagnets fails to meet the technology target of $\Delta \geq 65$ while $\Delta$ values for NCC MTJ nanomagnets do exceed 65. VW for devices made with NCC MTJs (MgO by NOX) in rows 4-5 are around 500-600 mV while VW for NCC MTJs that employ a MgO tunnel barrier fabricated with a ROX process is 700 mV.

So far, the prior art MTJ structures comprising a NCC layer within a free layer are capable of meeting the thermal stability factor requirement, but fail to satisfy the MR and VW requirements of advanced designs. Since TMR=$\Delta R/Rp=\Delta RA/RA$, and VW is directly related to R_p (RA_p/A) magnitude, we believe the best approach to achieve the desired values of TMR and VW while maintaining a high thermal stability factor is to reduce RA but without sacrificing the integrity of the MgO tunnel barrier.

Figure 2:
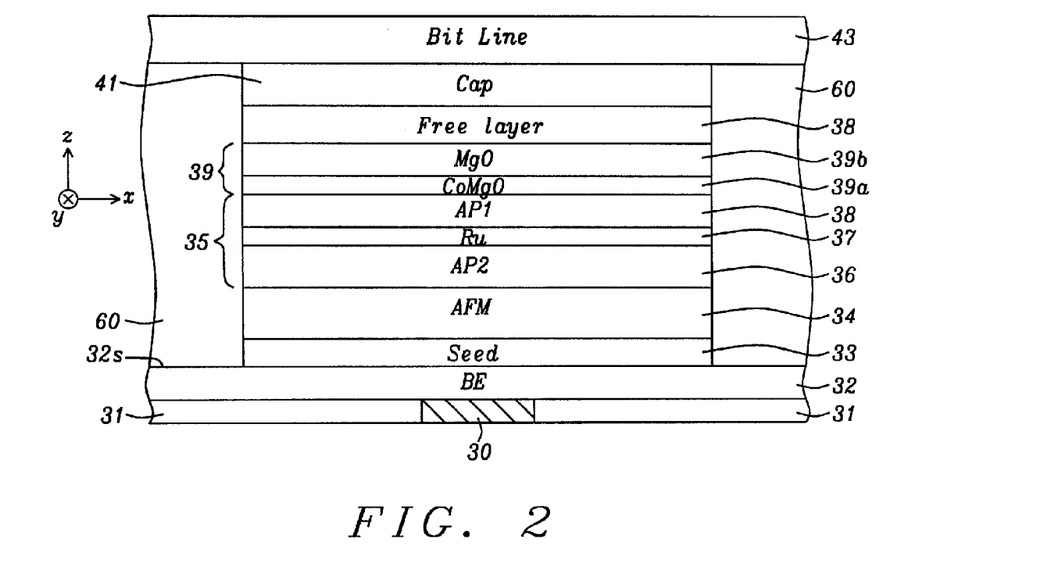
FIG. 2 is a cross-sectional view of a STT-RAM with a bottom spin valve MTJ structure formed according to a first embodiment of the present invention.

Referring to FIG. 2, one embodiment of a MTJ according to the present invention is depicted. A MTJ comprised of layers 33-41 is formed between a bottom electrode (BE) 32 and a bit line 43 in a STT-RAM device. BE 32 may be a composite layer comprised of a lower seed layer, middle conductive layer, and upper capping layer. In one embodiment, BE 32 has a TaN/NiCr/Ru/Ta configuration in which the lower TaN layer (not shown) is formed on a substrate that may be an insulation layer 31 comprised of silicon oxide or the like and the uppermost Ta layer contacts the seed layer 33. The insulation layer 31 may have a metal stud 30 formed therein so that electrical contact can be established between bit line 43 and a word line (not shown) in a sub-structure below the insulation layer. In one example, the thicknesses of the TaN, NiCr, Ru, and Ta layers in BE 32 are 30, 30, 100, and 120 Angstroms, respectively. However, the thickness of the various bottom electrode layers may be adjusted higher or lower to optimize performance as appreciated by those skilled in the art.

In another embodiment, the BE 32 includes at least an uppermost Ta layer (not shown) that may be subjected to sputter etching or ion milling to form an amorphous surface. The present invention also anticipates that an oxygen surfactant layer (OSL) may be formed on the Ta surface of the bottom electrode according to a method disclosed in U.S. Pat. No. 7,208,807 where a sputter etched Ta layer is exposed to an oxygen environment for a certain period of time.

Returning to the exemplary embodiment, an amorphous Ta top surface 32s on BE 32 is especially advantageous in promoting a uniform and dense growth in subsequently formed MTJ layers. The most critical layers in the MTJ stack are the tunnel barrier 39 and free layer 40. The tunnel barrier 39 must be extremely uniform over the wafer since small variations in thickness along the z-axis direction will result in a large variation in the resistance and in the RA value. In one embodiment, BE 32 is patterned to form an array of BE lines from a top view (not shown). Then, an insulation layer (not shown) is deposited and planarized by a conventional method to become coplanar with BE 32.

In the exemplary embodiment, a MTJ stack is fabricated on the patterned BE 32 by sequentially forming a seed layer 33, AFM layer 34, synthetic anti-ferromagnetic (SyAF) pinned layer 35, composite tunnel barrier 39, free layer 40, and cap layer 41. In an alternative embodiment (FIG. 9), a hard mask 42 may be formed between the cap layer and bit line 43. Referring again to FIG. 2, seed layer 33 is preferably NiCr but may be comprised of NiFe, NiFeCr, or other suitable materials. When a NiCr seed layer is grown on a Ta surface 32s or on an oxygen surfactant treated α-Ta surface in the bottom electrode 32, a smooth and dense (111) NiCr crystal orientation results which promotes smooth and densely packed growth in subsequently formed MTJ layers.

The AFM layer 34 is preferably comprised of MnPt with a thickness in the range of 120 to 200 Angstroms although an IrMn layer about 50 to 100 Angstroms thick or other materials such as NiMn, OsMn, RuMn, RhMn, PdMn, RuRhMn, or MnPtPd are also acceptable. SyAF pinned layer 35 may have a AP2/coupling/AP1 configuration to improve thermal stability of the MTJ and also reduce the interlayer coupling Hin (offset) field applied to the free layer. According to one embodiment, the AP2 layer 36 is made of CoFe, the coupling layer 37 is Ru, and the AP1 layer 38 is comprised of CoFe, CoFeB, or a combination thereof such as CoFeB/CoFe. In a preferred embodiment, the AP1 layer may have an uppermost Co layer since Co is more inert to oxidation due to oxygen migration from the tunnel barrier 39 than CoFeB (or CoFe). Thus, a CoFeB/Co composite AP1 layer 38 wherein the Co thickness is from 4 to 6 Angstroms is especially advantageous in the present invention. The thickness of the AP2 layer 36 and AP1 layer 38 may be changed to adjust the Ho (offset field) to approximately 0 Oe. In a preferred embodiment, a small negative Ho value between 0 and −20 Oe is desired since higher switching current is required for P to AP switching than AP to P switching, and the former process is facilitated by a slightly negative Ho value.

A key feature is a composite tunnel barrier 39 having a lower layer made of CoMgO 39a, and an upper MgO layer 39b. The CoMgO layer is formed by first co-sputtering Co and Mg targets within an Anelva sputter deposition mainframe or the like to deposit a CoMg layer having a thickness from 4.5 to 6 Angstroms. Depending on the relative power applied to the Co and Mg targets, a Co content between 20 and 40 atomic % may be realized in the resulting CoMg layer. For example, with a forward power of 80 W to the Co target, and 120 W to the Mg target, a 40:60 Co:Mg ratio is achieved in the CoMg film. Thereafter, a low power plasma treatment (PT) comprising 15 to 30 Watts and 100 sccm argon gas for a period of 15 to 30 seconds is performed to form a smooth top surface on the CoMg layer. Next, the plasma treated film is transferred to an oxidation chamber in the sputter deposition mainframe and oxidized by exposure to a 0.04 to 0.1 sccm flow of oxygen for 30 to 100 seconds and with an oxygen pressure of 0.03 to 0.1 mtorr. As a result, Mg atoms are oxidized and Co forms grains in the MgO matrix which is a very thin nearly continuous film. The volume fraction of Co in a CoMgO film having a Co:Mg ratio of 40:60 is about 20%. Note that oxidation of a Mg layer lowers the thickness of the film which means that a 4.5 Angstroms thick CoMg layer becomes less than 4.5 Angstroms after the Mg atoms are oxidized. In this context, a 4.5 Angstrom thick CoMg layer is equivalent to a HR-TEM measurement of around 5.8 Angstroms. A continuous MgO film is believed to have a thickness of at least 6.3 Angstroms (3 monolayers thick). Thus, the Co grains are believed to form conductive channels in an insulator matrix similar to Fe(Si) grains in a $SiO_2$ matrix within a NCC layer.

As improved deposition technology is developed to enable a lower Co content in the CoMg film, the Co grain size in the CoMgO layer is expected to decrease thereby enabling higher current (and greater heating) in the CoMgO layer.

Accordingly, higher current and greater heating will facilitate the Co electromigration from the AP1 layer into the CoMgO layer, and Co electromigration from CoMgO into the overlying MgO layer when current flows in a current perpendicular to plane (CPP) direction from free layer to pinned layer during a write process. Note that the electromigration will occur in the opposite direction when a current flows from the pinned layer to the free layer depending on whether a "1" or "0" is written during a write process. The net effect of the Co electromigration into the MgO barrier layer is expected to be increased spin torque within the MTJ as the electromigration force transfers momentum from electrons to the migrating ions.

Figure 3:
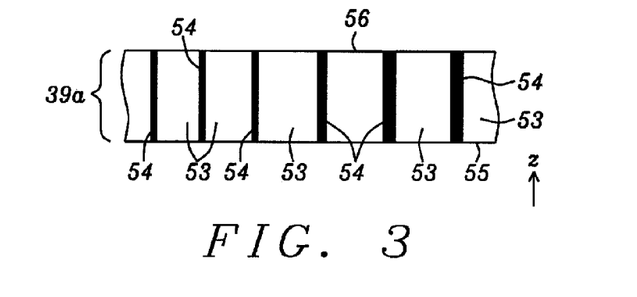
FIG. 3 is an enlarged cross-sectional view of a CoMgO tunnel barrier layer having Co nanoconstrictions formed in a MgO insulator matrix.

Referring to FIG. 3, columns of Co grains 54 are nanoconstrictions in the MgO layer 53 and conduct current in a perpendicular to plane direction along the z-axis through the CoMgO layer 39a. Returning to FIG. 2, in one embodiment a first Mg layer having an 8 Angstrom thickness is deposited on the CoMgO layer and is subsequently oxidized by a ROX method. Then a second Mg layer about 4 Angstroms thick is deposited on the resulting MgO layer. During a later annealing step, an essentially uniform upper MgO layer 39b is formed. As a result, both layers in the composite tunnel barrier 39 have a [100](001) crystal orientation wherein [100] refers to direction and (001) indicates plane. The CoMgO layer is employed to control electromigration of Co in the CoMgO layer 39a into the MgO layer 39b. Electromigration can be reversed by applying a voltage to drive a current in the pinned layer to free layer direction through the MTJ stack.

Our deposition method which involves a DC sputtering process with a metallic Mg target (or Co and Mg targets) results in a uniform Mg film (or CoMg film) that is particulate free. The desired RA value for a STT-RAM MTJ in a 64 Mb design is less than about 10 ohm-$\mu m^2$ for an in-plane MTJ embodiment and less than 5 ohm-$um^2$ for a MTJ with perpendicular magnetic anisotropy (PMA), and can be achieved by adjusting Mg and CoMg thicknesses and oxidation conditions. As explained in a later section, there is essentially no RA contribution from a CoMgO layer when the MgO insulator film is sufficiently thin.

It is known by those skilled in the art that a MTJ made from a crystalline (001) MgO tunnel barrier and an adjoining (001) CoFeB free layer is capable of delivering a very high dR/R (MR ratio) that results from coherent tunneling in which electron symmetry of the ferromagnetic electrode is preserved in tunneling through the crystalline [100] (001) MgO tunnel barrier. High dR/R is also achieved with the composite CoMgO/MgO tunnel barrier 39 of the present invention. The most common CoFeB composition is represented by $Co_SFe_{(80-S)}B_{20}$ where the content of B is 20 atomic % and s is the atomic % of Co. The as-deposited CoFeB film has an amorphous phase structure and remains amorphous unless recrystallization occurs by annealing above 300° C. Even though a CoFeB free layer has a somewhat higher intrinsic damping constant than a CoFe free layer, a crystalline (001) CoFeB free layer resulting from annealing above 300° C. has a high polarization that leads to significantly higher dR/R than a CoFe free layer. Nevertheless, the present invention encompasses a free layer 40 comprising either CoFe or CoFeB, or a combination thereof. Therefore, in one aspect, free layer 40 may be a single layer of CoFeB.

As indicated in related patent application Ser. No. 12/927,939, a nanocurrent channel (NCC) layer may be inserted in a CoFeB free layer to decrease the Gilbert damping constant α from 0.02 for a single $Co_{20}Fe_{60}B_{20}$ (19.5 Angstroms thick) free layer to 0.01 when a NCC layer is inserted to give a $Co_{20}Fe_{60}B_{20}15.5/NCC8/Co_{20}Fe_{60}B_{20}10$ configuration wherein the thicknesses of the lower and upper CoFeB layers are 15.5 and 10 Angstroms, respectively, and the middle NCC=Fe(25%)-SiO$_2$ layer has an 8 Angstrom thickness. The present invention anticipates that the Co content "s" in a $Co_SFe_{(80-S)}B_{20}$ alloy in free layer 40 in a NCC MTJ embodiment may be less than 20 atomic % in order to achieve a higher polarization and lower damping factor than $Co_{20}Fe_{60}B_{20}$. Thus, an "s" content as low as 10 atomic % as represented by $Co_{10}Fe_{70}B_{20}$ may further improve the performance of a NCC MTJ in a STT-RAM device. According to equation (1) and the equation $\eta(\theta)=P/[2(1+P^2 \cos \theta)]$ presented previously, a free layer having higher polarization (P) and lower damping constant results in lower switching current density Jc.

Figure 4:
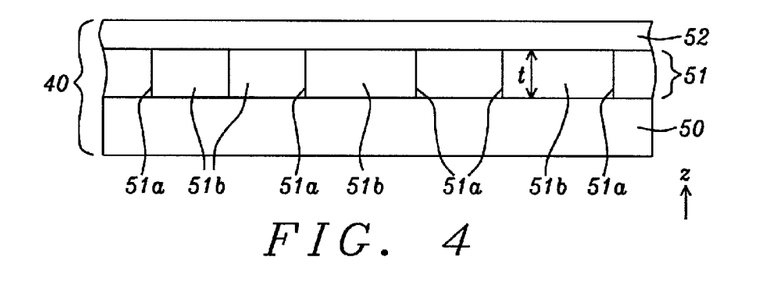
FIG. 4 is an enlarged cross-sectional view of a composite free layer in a second embodiment with a nano-current channel (NCC) layer formed between two free layers.

Referring to FIG. 4, free layer 40 may have a FL1/NCC/FL2 configuration according to a second embodiment of the present invention where a first ferromagnetic (FL1) layer 50 contacts the tunnel barrier layer 39, and a second ferromagnetic (FL2) layer 52 contacts an overlying cap layer 41. The NCC layer 51 has a thickness t and includes columns of a metal 51a such as Fe in an insulator matrix 51b such as SiO$_2$. Preferably, the middle NCC layer 51 has a thickness t of 6 to 10 Angstroms that is essentially the same value in Angstroms as the minimum RM grain size in the RMO, RMN, or RMON NCC layer where R is Fe, Co, Ni, or an alloy thereof such as CoFe, M is a metal such as Si or Al, and RM grains are formed as conductive channels in the metal (M) oxide, metal nitride, or metal oxynitride insulator matrix. In one embodiment, M is Si, and RSiO, RSiN, and RSiON are composites in which conductive R(Si) grains such as Fe(Si) or Co(Si) are magnetically and electrically coupled with the adjacent magnetic layers 50, 52, and are formed in an amorphous silicon oxide, silicon nitride, or silicon oxynitride insulator matrix. The R(Si) grains such as Fe(Si) or Co(Si) are typically formed in columnar shapes that may extend from the lower magnetic layer 50 to the upper magnetic layer 52. FL1 layer 50 and FL2 layer 52 are ferromagnetically coupled and therefore have a magnetic moment in the same direction. The magnetization direction of layers 50, 52 may either be aligned parallel or anti-parallel to the magnetization direction of AP1 reference layer 38. A FeSiO NCC layer is also referred to as a Fe—SiO$_2$ layer. In another aspect, R is Co or Fe, and M is Al to produce a CoAlO or FeAlO NCC layer 51 wherein Co(Al) or Fe(Al) grains are formed in an aluminum oxide matrix.

Upper magnetic layer 52 has a smaller thickness of about 6 to 10 Angstroms (8-13 Angstroms by HR-TEM measurement) compared with the lower magnetic layer 50 which has a thickness between 14.5 and 15.5 Angstroms (19-20 Angstroms by HR-TEM). Preferably, the lower (FL1) magnetic layer 50 has a thickness sufficiently large to form a continuous film which is believed to occur at approximately 13 Angstroms or slightly above that thickness value. However, raising FL1 thickness too high results in a higher $J_{CO}$. On the other hand, FL2 thickness is maintained below about 12 Angstroms to achieve a paramagnetic behavior in the absence of ferromagnetic coupling. It should be understood that FL1-FL2 coupling through the middle NCC layer 51 produces a ferromagnetic property in the FL2 layer 52. Thus, when the lower magnetic layer 50 is switched, the coupling will also result in FL2 layer 52 reversing its magnetic moment. A greater FL2 thickness increases Bs and VR which is desirable, but unfortunately $J_{CO}$ also increases.

In the exemplary embodiment depicted in FIG. 2, free layer 40 may have a FL1/NCC/FL2 configuration represented by CoFeB/Fe—SiO$_2$/CoFeB, and the cap layer 41 may be Ru. The spin current in the Fe—SiO$_2$ (NCC 51) portion of the free layer passes only through the nano-conducting channels 51a within a silicon oxide matrix 51b (FIG. 4). As a result, there is high current density about 10-fold greater than in typical free layers comprised of CoFeB with no NCC layer which will cause reverse domain nucleation in which the domain wall will be pushed out by the continuous injection current in the STT-RAM until the entire free layer switches. Thermal heating caused by local current density may also contribute to magnetization switching in the two CoFeB layers. Because of the existence of reverse magnetization grains in the NCC layer and their coupling to the FL1, FL2 layers, the magnetization switching of layers 50, 52 will be much easier than when a NCC layer is not present in the MTJ. In effect, the single spin valve (MTJ) described herein behaves like a dual spin valve (DSF) but without a reduction in dR/R in that the spin polarized current, is reflected back from a free layer/Ru cap layer interface and accumulates in the free layer. The enhancement of the transverse spin accumulation increases the spin torque and therefore effectively reduces the switching current.

In an embodiment where the NCC layer 51 is Fe—SiO$_2$ (also known as FeSiO), deposition is preferably accomplished by RF-magnetron sputtering from a Fe(20 atomic %)-SiO$_2$ single target to provide a NCC thickness from 5 to 8 Angstroms, and preferably 7 to 8 Angstroms. A Fe content substantially less than 20 atomic % (i.e. Fe 15 atomic %) is likely to lead to incomplete channel formation within the NCC layer thereby degrading heating capacity. According to S. Honda et al. in "Tunneling giant magnetoresistance in heterogeneous Fe—SiO$_2$ granular films", Phys. Rev. B. V 56, p 14566 (1997), the volume fraction of the Fe(Si) granules in the SiO$_2$ matrix is calculated to be 0.115 for a NCC layer from sputtering of a Fe(25 atomic %)-SiO$_2$ target. The isolated Fe(Si) granules have a diameter ranging from 10 to 20 Angstroms which means a minimum grain size of about 10 Angstroms.

We have set the lower limit of granule diameter distribution (10 Angstroms) as our process of record (POR) NCC layer 51 thickness in order to ensure uniformity in the NCC channels 51a between FL1 layer 50 and FL2 layer 52. When the NCC thickness is greater than about 10 Angstroms, then some of the Fe(Si) granules fail to function as nano-current channels which leads to a high resistance in NCC layer 51 thereby increasing RA and Rp_cov of the MTJ which includes composite free layer 40. Note that a NCC layer 51 denoted herein as FeSiO8 (or NCC8) based on a MagIC scale, for example, has a thickness of 10 Angstroms (about 1.3× greater) as calibrated by a HR-TEM instrument. If the NCC thickness is too small, then the FL1-FL2 coupling is too large and increases Bs which degrades performance.

Figure 5:
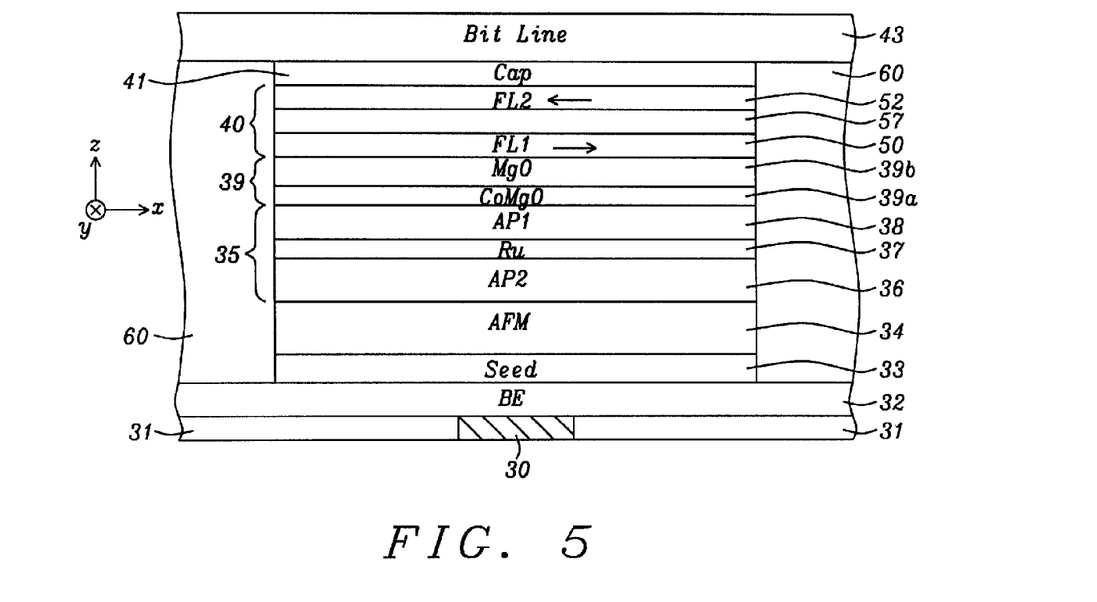
FIG. 5 is a cross-sectional view of a STT-RAM with a bottom spin valve MTJ structure in which the free layer has a SyAP configuration according to a third embodiment of the present invention.

Referring to FIG. 5, a third embodiment of the present invention is illustrated and retains all of the features of the first two embodiments except the free layer 40 has a synthetic anti-ferromagnetic free (SyAF) configuration wherein the lower FL1 layer 50 is anti-ferromagnetically coupled to the upper FL2 layer 52 through a coupling layer 57 such as Ru. In one aspect, FL1 and FL2 layers may both be CoFeB and have in-plane magnetization. As a result, the net magnetization of the free layer 40 is reduced to approximately zero depending on the relative thicknesses of layers 50, 52 because of nearly equal and opposite magnetic moments in the FL1 and FL2 layers.

In related patent application Ser. No. 13/068,172, we described how including a moment dilution layer inserted in a free layer is beneficial in terms of improving thermal stability independently of the free layer moment, volume, crystal anisotropy while maintaining a high MR ratio in the spin valve element. In effect, the moment dilution layer has a lower magnetization than that of the free layer material which it is replacing. As a result, the overall Ms of the free layer (assuming no thickness change) is reduced by replacing a portion of a high magnetization free layer such as CoFeB with an alloy having low magnetization or with a metal with no magnetic moment. Moreover, interfacial perpendicular anisotropy referred to as $Hk\perp$ (interfacial) between oxide and magnetic metal has been predicted by first principles calculation. When a CoFe or CoFeB layer, which normally has in-plane magnetization, adjoins an oxide layer such as MgO, for example, the magnetization of the CoFe or CoFeB layers can be aligned out-of-plane. For example, the shape anisotropy field $4\pi Ms$ for a $Co_{20}Fe_{60}B_{20}$ free layer is approximately 12000 Oe. Depending on the composition of the modified free layer, we have found interfacial perpendicular anisotropy may be greater than 12000 Oe by maintaining thicknesses in the 5 to 20 Angstrom range in the upper and lower portions of the free layer in a FL1/moment diluting layer/FL3 configuration. Under such conditions, an out-of-plane magnetization (perpendicular anisotropy) is established in the free layer. If the free layer thickness is above about 19 Angstroms, then the shape anisotropy field is too large to be overcome by an out-of plane component, and the magnetization of the free layer remains in-plane.

Figure 6:
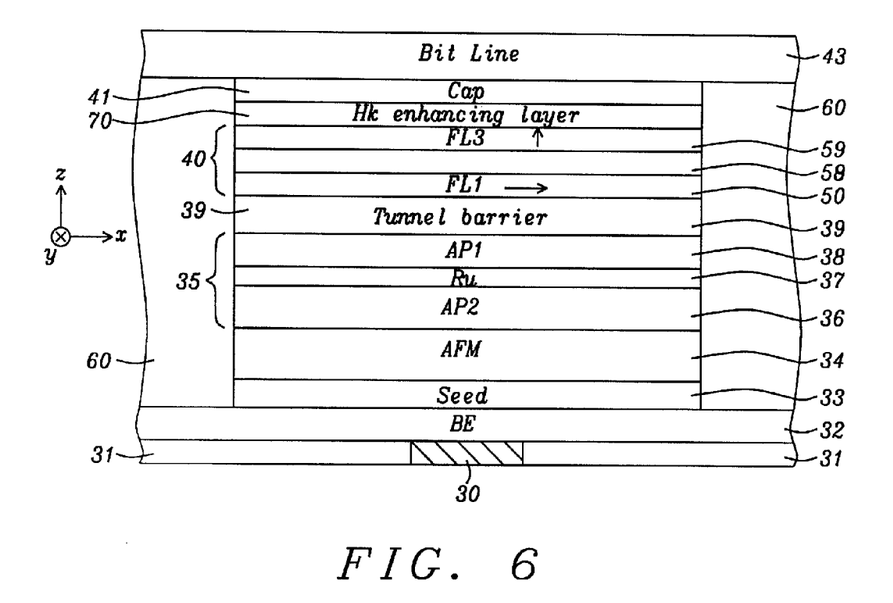
FIG. 6 is a cross-sectional view of a STT-RAM with a bottom spin valve MTJ structure in which a composite free layer has a moment diluting layer formed between two free layers, and a perpendicular Hk enhancing layer between the free layer and cap layer according to a fourth embodiment of the present invention.

Referring to FIG. 6, a fourth embodiment of the present invention is depicted in which a MTJ has PMA in at least the free layer 40. A moment diluting (Ms reducing) layer 58 such as Ta is inserted between the FL1 layer 50 having, in-plane anisotropy and a ferromagnetic FL3 layer 59 with perpendicular anisotropy in a composite free layer 40. The FL3 layer has a first interface with the moment diluting layer and a second interface with an overlying perpendicular Hk enhancing layer 70 to increase the perpendicular anisotropy field in the FL3 layer. In one embodiment, the free layer 40 has a CoFeB/Ta/CoFeB configuration wherein a top surface of the upper CoFeB layer contacts the perpendicular Hk enhancing layer 70. According to one aspect of the present invention, the FL1 layer interface with the tunnel barrier generates a sufficient perpendicular anisotropy field in the FL1 layer to partially cancel the demagnetization field of the FL1 layer while the magnetization in the FL1 remains in-plane. In an alternative embodiment, the FL3 layer 59 may have a CoFeB/Co structure wherein the upper Co layer is in contact with an overlying CoMgO or composite CoMgO/MgO perpendicular Hk enhancing layer 70 to improve FL3 perpendicular anisotropy. The tunnel barrier 39 in this embodiment may be MgO or a composite with a CoMgO/MgO configuration as described in previous embodiments.

In a preferred embodiment, the moment diluting layer 58 may be one or more of Ta, Al, Si, B, V, Ti, Mg, Hf, Cr, Cu, Ag, and Au. Alternatively, the moment diluting layer may be comprised of CoFe, NiCo, NiFe, CoFeNi, CoB, or FeB that is doped with one or more of Ta, Al, Si, B, V, Ti, Mg, Hf, Cr, Cu, Ag, Au, or Os wherein the doped metal has a content from 5 to 50 atomic % in the alloy.

According to one embodiment, the perpendicular Hk enhancing layer 70 is comprised of an oxide such as CoMgO or a CoMgO/MgO composite, having a thickness and oxidation state that are controlled to give a resistance x area (RA) product smaller than that of the tunnel barrier layer 39 in order to minimize a reduction in the MR ratio. Note that a CoMgO layer with a thickness as described previously that results in a discontinuous layer has a RA of essentially 0. The perpendicular Hk enhancing layer may be comprised of other oxides including MgO, SiOx, SrTiOx, BaTiOx, CaTiOx, LaAlOx, MnOx, VOx, AlOx, TiOx, and HfOx. In yet another embodiment, the perpendicular Hk enhancing layer may be one of Ru, Ta, Ti, B, V, Mg, Ag, Au, Cu or Cr. Moreover, when the perpendicular Hk enhancing layer is an oxide, the oxide may be embedded with conductive particles made of one or more of Fe, Co, Ni, B, Ru, Cr, Au, Ag, and Cu to lower the resistivity therein. A CoMgO perpendicular Hk enhancing layer 70 is preferably formed with the process described previously with respect to fabricating a CoMgO tunnel barrier layer 39a. It should be understood that including MgO in a Hk enhancing layer will result in higher RA (and higher VW). Therefore, a perpendicular Hk enhancing layer made of a discontinuous CoMgO film is preferred since it does not contribute to RA.

Figure 12A:
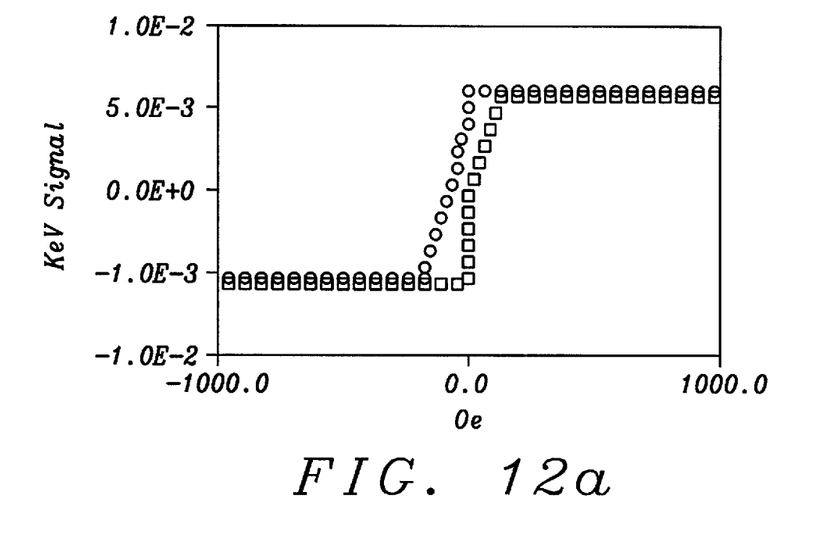
Figure 12B:
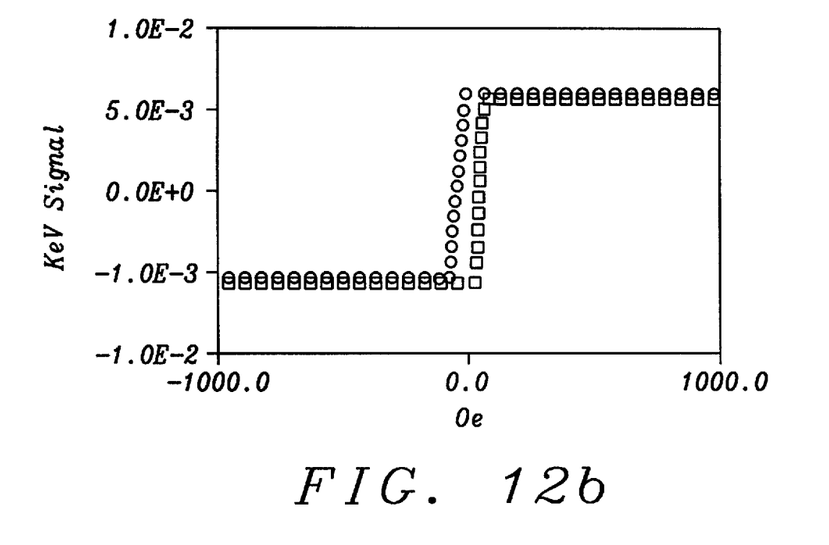

Referring to FIG. 12a, a PMA hysteresis plot is illustrated for a MTJ configuration comprising a CoFeB pinned layer, MgO (ROX) tunnel barrier, CoFeB10/Ta1.5/CoFeB free layer, CoMgO/Mg2.5 Hk enhancing layer, and Ru cap layer. The CoMgO layer is formed by depositing 4.5 Angstroms CoMg and then performing a NOX process with 18 sccm $O_2$ for 300 seconds. A 2.5 Angstrom thick Mg layer is subsequently deposited and becomes oxidized during a later anneal step. FIG. 12b is a similar plot for a MTJ wherein the 2.5 Angstrom thick Mg layer is omitted such that a Ru cap layer is formed directly on the CoMgO perpendicular Hk enhancing layer. We observe that a free layer capped with a very thin (discontinuous) CoMgO layer (FIG. 12b) exhibits PMA character while a free layer capped with a continuous CoMgO layer (FIG. 12a) has considerably less PMA. Note that including a second CoMgO layer to form a composite CoMgO/MgO tunnel barrier layer in the aforementioned MTJ would be beneficial in lowering device RA and improving MR ratio as mentioned earlier with regard to Table 2.

In an embodiment wherein the perpendicular Hk enhancing layer 70 is an oxide such as CoMgO or CoMgO/MgO, the cap layer 41 is preferably a metal such as Ru with an energy of oxide formation considerably greater than that of the perpendicular Hk enhancing layer. Ta is not desirable as a cap layer since it leads to device shunting and shorting, and low Hc (low thermal stability). Thus, the MTJ with a bottom spin valve configuration may be represented by seed layer/AFM layer/pinned layer/tunnel barrier/composite free layer/perpendicular Hk enhancing layer/capping layer.

Figure 10:
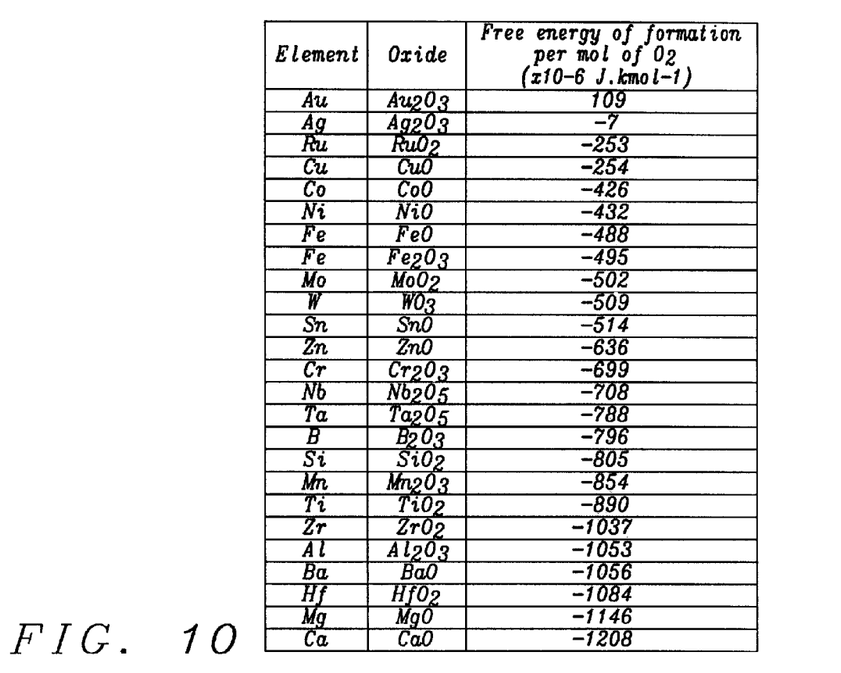
FIG. 10 is a table showing the free energy of oxide formation for various elements.

FIG. 10 lists the free energy of oxide formation of various elements. As explained in related patent application Ser. No. 12/931,866, if MgO is selected as the perpendicular Hk enhancing layer, a capping layer material having a free energy of oxide formation substantially higher than −1146 kJ./mole is preferred. It is believed that a CoMgO perpendicular Hk enhancing layer 70 of the present invention should have a free energy of oxide formation similar to that reported for MgO since the CoMgO layer has a MgO insulator matrix as the major component. Elements near the top of the table in FIG. 10 are preferred as a cap layer over elements near the bottom of the table since the former have a less negative value (higher energy of oxide formation) than the latter. It follows that Ta is less desirable than Ru as the cap layer 41 since Ta has an affinity for oxygen close to that of Mg which means oxygen is more likely to migrate from the MgO (or CoMgO) Hk enhancing layer into a Ta capping layer than into a Ru capping layer during annealing. A loss of oxygen from an oxide Hk enhancing layer lowers the interfacial perpendicular anisotropy at the interface with the adjoining portion of free layer 40 thereby reducing the induced PMA in the FL3 free layer 59. With regard to a CoMgO perpendicular Hk enhancing layer, a Ru cap layer 41 is highly preferred since we have found that a Ta capping layer dramatically reduces PMA in the FL3 free layer to essentially zero.

A thin Ru capping layer 41 between 10 and 30 Angstroms thick not only enhances dR/R but also considerably lowers the critical current $J_{CO}$. A substantial reduction in Jc is believed to result primarily because the Ru layer serves as a strong spin scatterer for the majority electrons which leads to an enhanced spin accumulation at the FL3 layer 59/capping layer 41 interface (and at the FL2 layer 52/capping layer 41 interface in a NCC free layer embodiment). The enhanced spin accumulation will increase the polarized current inside the free layer and thus produce an additional spin torque to act on the FL3 layer magnetization.

Figure 7:
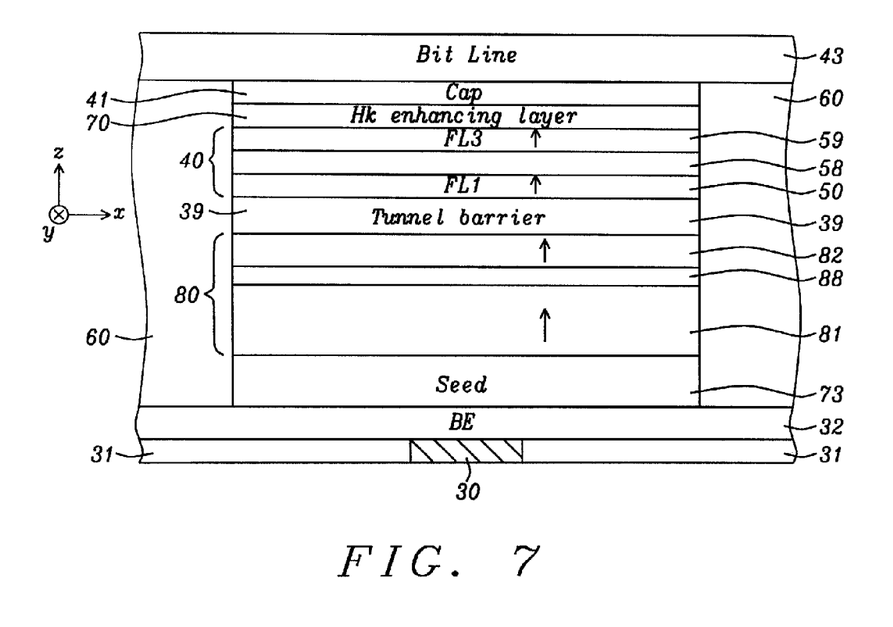
FIG. 7 is a cross-sectional view of a STT-RAM with a bottom spin valve MTJ wherein both of the pinned layer and free layer are composites with a moment dilution layer and exhibit perpendicular magnetic anisotropy.

Referring to FIG. 7, the present invention also encompasses an embodiment wherein the pinned layer has PMA character. For example, the spin valve structure may have a seed/[Ni/Co]$_n$/Ta/CoFeB/tunnel barrier/free layer/Hk enhancing layer/cap layer configuration where PMA is established in the [Ni/Co]$_n$ layer 81 portion of the pinned layer 80 by "n" laminations of thin Ni and Co layers, and by an appropriate selection of seed layer 73 such as NiCr or Ta/Ru/Cu. PMA may be generated in the upper CoFeB layer 82 portion of the pinned layer by an interface with an overlying oxide in tunnel barrier layer 39. A moment dilution layer 88 having the same properties as described previously for moment dilution layer 58 may be advantageously formed between layers 81, 82 in the composite pinned layer 80. It should be understood that the upper portion of the pinned layer 80 may have a CoFeB/Co composite configuration instead of a single CoFeB layer. In a preferred embodiment, the tunnel barrier layer 39 is a composite with a lower CoMgO layer 39a contacting the pinned layer and an upper MgO layer 39b contacting the free layer. The upper portion of the spin valve depicted in FIG. 7 may have free layer 40, Hk enhancing layer 70, and cap layer 41 as described previously with respect to the fourth embodiment in FIG. 6. Note that arrows within layers 50, 59, 81, 82 indicate a magnetization in the z-axis direction.

Figure 8:
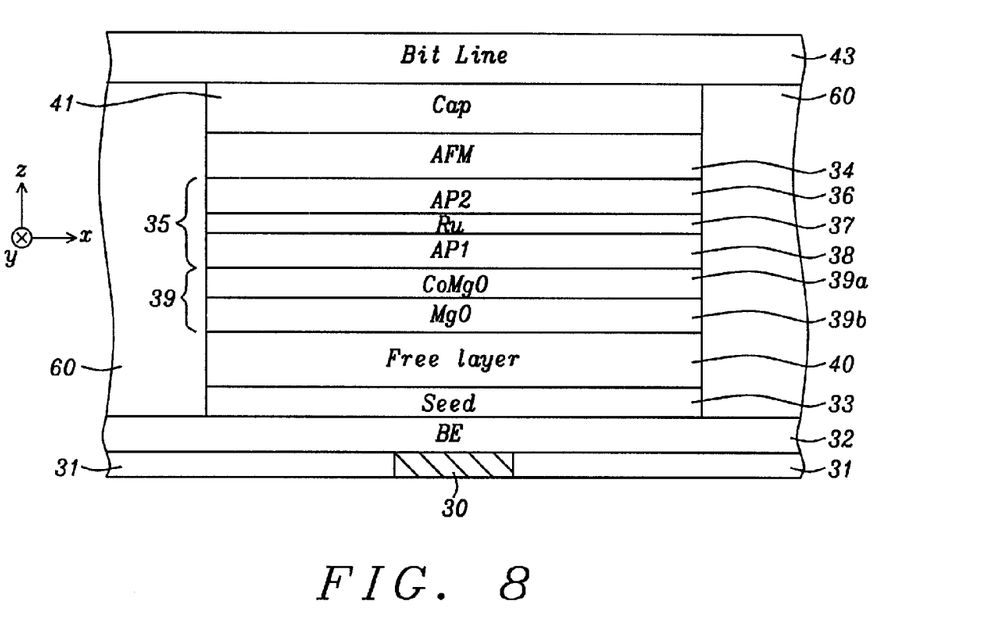
FIG. 8 is a cross-sectional view of a STT-RAM with a top spin valve MTJ and a composite tunnel barrier layer according to an embodiment of the present invention.

Referring to FIG. 8, another embodiment of the present invention is depicted and represents a top spin valve structure wherein a seed layer 33, free layer 40, composite tunnel barrier layer 39, pinned layer 35, AFM layer 34, and a cap layer 41 are sequentially formed on a bottom electrode 32. In this case, the composite tunnel barrier preferably has a MgO layer 39b contacting the free layer and a CoMgO layer 39a contacting the AP1 portion 38 of the SyAP pinned layer 35. The pinned layer may have a Co/CoFeB/Ru/CoFe configuration wherein the lower Co layer interfaces with the CoMgO layer 39a. Free layer 40 may be a single layer of CoFeB or CoFe, a SyAF structure as previously described, or a CoFeB/NCC/CoFeB composite as described in a previous embodiment.

Figure 9:
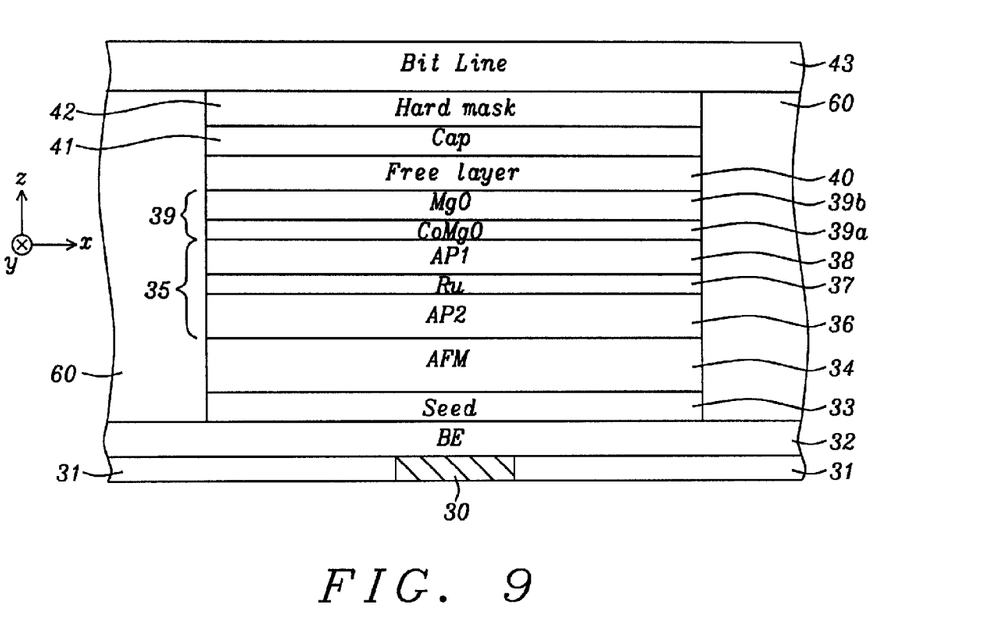
FIG. 9 is a cross-sectional view of a bottom spin valve MTJ having a hard mask layer formed between the cap layer and a bit line according to an embodiment of the present invention.

In yet another embodiment illustrated in FIG. 9, a hard mask layer 42 may be deposited on a top surface of cap layer 41. Hard mask 42 may be a composite comprised of a lower MnPt layer that contacts cap layer 41 and an upper Ta layer on the MnPt layer. The MnPt/Ta configuration is designed especially for RIE processes used to pattern the MTJ structures of this invention. Optionally, for ion beam etching (IBE) processes, alternative hard masks may be employed. According to a preferred embodiment, the hard mask has an upper Ta layer thickness from 300 to 500 Angstroms, and a lower MnPt layer thickness from 200 to 300 Angstroms. A MnPt layer is employed to avoid using a 600 Angstrom thick Ta hard mask which would require a thicker photoresist layer (lower pattern resolution) during the hard mask patterning process. In another embodiment, hard mask 42 may be comprised of MnPt only.

The bottom electrode layer 32 and MTJ layers 33-41 or 33-42 including a perpendicular Hk enhancing layer 70 in the fourth embodiment may be formed on a substrate that is an insulation layer 31 made of silicon oxide, alumina, or the like and comprising a via stud 30. The stud 30 is connected to a transistor drain (not shown) in an underlying sub-structure. The transistor is typically used in a write or read process that determines the resistance state of the bit cell (MTJ) once the MTJ stack of layers is patterned to form a MTJ nanopillar structure and a bit line is formed on the MTJ nanopillar. Note that unlike conventional MRAM, magnetization switching in a STT-RAM MTJ is accomplished by passing current through a bit cell and not by fields induced by current in a word line and a bit line. The bottom electrode 32 may have an area size in the "x, y" plane greater than that of overlying MTJ layers.

The MTJ stack of layers in all embodiments may be formed in the same process tool as the bottom electrode layer 32. For instance, the bottom electrode 32 and MTJ stack may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom electrode layer 32 and overlying MTJ layers 33-41 or 33-42 including layer 70 in the fourth embodiment may be formed after a single pump down of the sputter system to enhance throughput. Oxidation processes used to form CoMgO and MgO layers 39a, 39b are typically performed in an oxidation chamber within the sputter deposition tool. A CoMgO perpendicular Hk enhancing layer 70 is formed by a plasma treatment of a CoMg layer followed by a natural oxidation as described earlier.

Once the MTJ stack of layers is laid down on the BE 32, a high temperature annealing may be performed. For example, a stack of in-plane MTJ layers may be annealed in a vacuum by applying a magnetic field of 5000 to 10000 Oe in magnitude along the x-axis (easy axis) for 1 to 5 hours at a temperature of about 300° C. to 360° C. In the case of a MTJ with PMA, the stack of MTJ layers may be annealed in a vacuum without applying a magnetic field along the easy axis (z-axis) for 1 to 2 hours at a temperature from about 240° C. to 300° C.

Thereafter, an array of MTJ elements with essentially vertical sidewalls may be fabricated by a method involving a reactive ion etch (RIE) process as well known by those skilled in the art. First, a photoresist layer (not shown) is coated on the cap layer 41 (or hard mask 42) and is then patterned by a conventional photolithography process. A pattern of islands is formed in the photoresist layer wherein each island corresponds to the desired ellipse shape or another shape of the MTJ nanopillar from a top view. The patterned photoresist layer then functions as an etch mask during a first reactive ion etch (RIE) process in a RIE system mainframe which removes uncovered regions of the uppermost layer in the MTJ stack (cap layer or hard mask). The photoresist layer may be stripped and a second RIE process is employed to selectively etch through regions of the MTJ stack that are not protected by the uppermost layer. As a result, the pattern of islands initially formed in the photoresist layer is transferred through the MTJ stack of layers to form an array of MTJ nanopillars. Since a RIE process is used to generate essentially vertical sidewalls in the MTJ nanopillars, a more dense array of MTJs is possible than when an ion beam etch (IBE) is employed as in the prior art.

Figure 11:
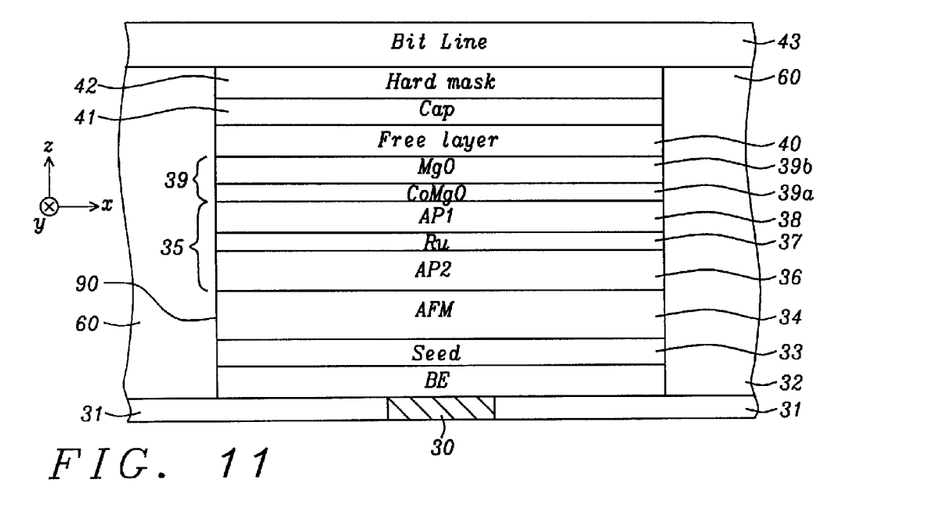
FIG. 11 is a cross-sectional view of a STT-RAM with a bottom spin valve MTJ and a patterned bottom electrode that shares a common sidewall with the MTJ layers according to an embodiment of the present invention.

Referring to FIG. 11, the present invention anticipates an additional embodiment wherein the BE layer is patterned simultaneously with the MTJ stack of layers. In other words, the second RIE step described above is extended so that the etch process continues through the BE layer and forms a BE 32 having essentially the same shape from a top view as the overlying MTJ nanopillar. MTJ layers 33-42 and BE 32 share the same sidewall 90. This embodiment allows a greater MTJ nanopillar density in the STT-RAM array than in the previous embodiment (FIG. 2).

In all embodiments, following formation of an array of MTJ nanopillars, a second insulation layer 60 is deposited on the BE 32 and/or substrate 31 to a level that fills in the spaces between adjacent MTJ nanopillars. A CMP process is used to remove an upper portion of the second insulation layer and thereby expose the cap layer 41 (or hard mask layer 42). Thus, the second insulation layer 60 becomes coplanar with the uppermost layer in the MTJ nanopillar. Then a conductive material such as Cu, Al, or alloys thereof may be deposited on the second insulation layer and over the uppermost MTJ layer 41 or 42. Next, a bit line 43 that contacts the uppermost MTJ layer is delineated by patterning the conductive layer using a well known photoresist patterning and etching sequence.

To demonstrate the effectiveness of a composite tunnel barrier of the present invention, an experiment was performed to build unpatterned MTJ stacks with a BE/NiCr45/MnPt150/SyAP pinned layer/tunnel barrier/free layer/cap layer configuration and then measure MTJ properties including MR and RA by B—H looper and CIPT. Although current is used to measure R_p/R_ap (RA_p/RA_ap), switching of the free layer is made by a magnetic field. In Table 2, the pinned layer has a AP2/Ru/AP1 configuration where AP2 is $Co_{75}Fe_{25}$ with a 30.2 Angstrom thickness and the Ru layer is 7.5 Angstroms thick. CoMgO layers were prepared by depositing a 4.5 Angstrom thick CoMg layer followed by a plasma treatment comprising Ar gas, a power of 15 Watts for 30 seconds, and then forming an oxygen surfactant layer on the plasma treated CoMg surface with a 0.04 or 0.08 slm flow rate of $O_2$ for 60 seconds. MgO tunnel barrier layers were prepared by a process sequence described previously that involves depositing a first Mg layer 8 Angstroms thick followed by a ROX process and then deposition of a second Mg layer that is 4 Angstroms thick. In all examples, the free layer is made of $Co_{20}Fe_{60}B_{20}$.

TABLE 2

Magnetic Properties of unpatterned MTJ with NiCr45/MnPt150/$Co_{75}Fe_{25}$30/Ru7.5/ $Co_{20}Fe_{60}B_{20}$14/upper AP1 pinned layer/CoMgO/MgO/free layer/Ru30/Ta30/Ru30 configuration on a bottom electrode (BE)

| Upper AP1 Pinned Layer | CoMgO portion of tunnel barrier | Free Layer | RA | MR | BS | Hc | He | Hk |
|---|---|---|---|---|---|---|---|---|
| Row 1 = Co6 (PT30/SL30) | None | CoFeB19.5 | 3.7 | 143 | 0.59 | 5.8 | 41 | 39 |
| Row 2 = Co6 | CoMg4.5/PT30s/ SL0.04 60s | CoFeB19.5 | 3.6 | 153 | 0.58 | 6.6 | 31 | 31 |
| R3 = $Co_{75}Fe_{25}$6 (PT30/SL30) | None | CoFeB15.5/Co15%—$Al_2O_3$7/CoFeB10 | 6.7 | 128 | 0.68 | 13.4 | 19 | 35 |
| Row 4 = Co6 | CoMg4.5/PT30s/ SL0.08 60s | CoFeB15.5/Co15%—$Al_2O_3$ 7/CoFeB10 | 5.4 | 140 | 0.71 | 12.4 | 29 | 39 |
| Row 5 = Co6 | CoMg4.5/PT30s/ SL0.04 60s/Mg2 | CoFeB15.5/Co15%—$Al_2O_3$ 7/CoFeB10 | 7.1 | 133 | 0.71 | 11.9 | 20 | 35 |

Note that with non-NCC MTJs in rows 1 and 2, insertion of a CoMgO tunnel barrier (Row 2) does not affect the RA value. In Row 1, an oxygen surfactant layer was formed on the CoFeB/Co AP1 layer prior to forming a MgO tunnel barrier. Unlike sputter deposited NCC layers, CoMgO made from a natural oxidation of a very thin CoMg layer does not increase RA which indicates the MgO insulator matrix portion of CoMgO is not formed as a continuous film. Keep in mind that a 4.5 Angstrom thick CoMgO layer by our measurement is equivalent to a 5.8 Angstrom thick CoMgO film using a HR-TEM measurement. S. Yuasa et al. in "Characterization of growth and crystallization process in CoFeB/MgO/CoFeB MTJ structure", Appl. Phys. Lett. 87, 242503 (2005) confirms that three monolayers of MgO or about 6.3 Angstroms thickness is required for a continuous MgO film.

Returning to Table 2, MR increased by 7% for row 2 vs. row 1 due to the current crowding effect through Co grains in the discontinuous MgO layer within CoMgO. For the NCC MTJs in rows 3-4, CoMgO insertion results in a 9% increase in MR and a 19% reduction in RA as observed in the comparison of row 4 vs. row 3. A 19% RA reduction is also found in Table 1 (Row 3 vs. Row 2) where both MTJs have a tunnel barrier made only of MgO (ROX process) and the RA reduction is attributed to the presence of Co as the upper AP1 layer. Therefore, we conclude from Table 2 that a very thin (discontinuous) CoMgO layer does not contribute to RA since Co grains in CoMgO serve as nanoconstrictions to conduct the switching current. Moreover, MR (dR/R) does not suffer by insertion of a CoMgO to form a composite CoMgO/MgO tunnel barrier. As a result, it is believed that the CoMgO layer has the same [100](001) structure as the MgO tunnel barrier layer. The CoMgO layer in row 6 is intentionally made with an upper 2 Angstrom thick Mg layer to form a continuous film which demonstrates an increase in RA.

The critical switching current density for programming a typical STT-RAM is $Jc \sim 2$ MA/cm$^2$. For the CoMgO/MgO/NCC MTJ of the present invention, the current density Jc through the CoMgO nanoconstrictions is several MA/cm$^2$ and the device temperature T* for the device during writing may be as high as 600° K. These are severe conditions for studying "electromigration" in interconnects in integrated circuits. In a CoFeB/Co/CoMgO/MgO/CoFeB/Co—AlOx/CoFeB MTJ as described herein and shown in Table 2, applying a positive current (electron injection from the reference layer into the free layer for AP to P switching), Co ions in the CoMgO (and Co underlayer) nanoconstriction migrate in the direction of electron flow into the MgO tunnel barrier layer. Adding metallic ions (in this case Co) into a MgO insulator improves the conductance of the insulator thereby reducing RA_p. Applying a negative current (for P to AP switching) leads to the return of the displaced Co ions back into the CoMgO nanoconstriction (and Co underlayer) to essentially display a reversible behavior. Since TMR (MR ratio)=ARA/RA, lower RA results in higher TMR. In terms of VW, RA reduction in nanomagnet devices of Rows 4 and 5 in Table 2 can be reduced from 500-700 mV to less than 400-500 mV.

Taking advantage of current induced resistance changes by controlled electromigration in local Co nanoconstrictions within our novel CoMgO layer in a composite CoMgO/MgO tunnel barrier, we have achieved improved performance in a MTJ within a STT-RAM structure. In particular, Hc greater than 160 Oe and thermal stability factor $\Delta > 65$ is maintained while MR ratio is increased and RA lowered to meet design requirements for a 64 Mbit device. Low $Jc_0$ is also observed by way of the increased heating provided by nanoconstrictions in the CoMgO layer. The composite tunnel barrier of the present invention may be used in combination with various free layer and pinned layer configurations that exhibit one or both of in-plane anisotropy and PMA. Moreover, a CoMgO layer may be employed as a perpendicular Hk enhancing layer between a free layer and a cap layer in a bottom spin valve design.

While this invention has been particularly shown and described with reference to, the preferred embodiment thereof, it will be understood by those skilled in the art that various changes in form and details may be made without departing from the spirit and scope of this invention.

We claim:

1. A magnetic tunnel junction (MTJ) nanopillar structure formed on a bottom electrode in a STT-RAM device, comprising:
    (a) a pinned layer;
    (b) a free layer; and
    (c) a composite tunnel barrier layer including a CoMgO layer having Co nanoconstrictions formed in a MgO matrix that interfaces with the pinned layer, and a MgO layer which forms interfaces with the CoMgO layer and the free layer to give a MTJ nanopillar structure with a pinned layer/CoMgO/MgO/free layer or free layer/MgO/CoMgO/pinned layer configuration, the nanoconstrictions are columns of Co grains that conduct current in a perpendicular to plane direction in the CoMgO layer.

2. The MTJ nanopillar structure of claim 1 wherein a ratio of Co:Mg in the CoMgO layer is from about 2:8 to 4:6.

3. The MTJ nanopillar structure of claim 1 wherein the CoMgO layer has a thickness between about 4.5 and 6 Angstroms and the MgO layer has a thickness from about 8 to 12 Angstroms.

4. The MTJ nanopillar structure of claim 1 wherein the free layer is a single layer of CoFeB or CoFe, or is a composite with a CoFeB/Ru/CoFeB configuration in which the CoFeB layers are anti-ferromagnetically coupled through a Ru layer.

5. The MTJ nanopillar structure of claim 1 wherein the free layer is a composite with a CoFeB/NCC/CoFeB configuration wherein NCC is a nanocurrent channel layer with Fe(Si) or Co(Si) grains formed in a silicon oxide matrix, or with Fe(Al) or Co(Al) grains formed in an aluminum oxide matrix.

6. The MTJ nanopillar structure of claim 1 wherein the free layer is a composite with a CoFeB/moment dilution layer/CoFeB configuration wherein the moment dilution layer is one or more of Ta, Al, Si, B, V, Ti, Mg, Hf, Cr, Cu, Ag, and Au.

7. The MTJ nanopillar structure of claim 6 further comprised of a seed layer contacting the bottom electrode, and a stack comprising a lower perpendicular Hk enhancing layer and an upper cap layer formed on the composite free layer to give a seed layer/pinned layer/CoMgO/MgO/free layer/perpendicular Hk enhancing layer/cap layer configuration.

8. The MTJ nanopillar structure of claim 7 wherein the perpendicular Hk enhancing layer is a CoMgO layer having Co nanoconstrictions formed in a MgO matrix, or is a CoMgO/MgO composite, and the cap layer is Ru.

9. A MTJ with a bottom spin valve structure made of a stack of layers formed on a bottom electrode in a STT-RAM device, comprising:
    (a) a seed layer formed on the bottom electrode;
    (b) an anti-ferromagnetic (AFM) layer contacting a top surface of the seed layer;
    (c) a pinned layer on the seed layer;
    (d) a composite tunnel barrier layer having a CoMgO layer which has Co nanoconstrictions that are columns of Co grains formed in a MgO matrix, the CoMgO layer contacts the pinned layer, and a MgO layer which forms an interface with an overlying free layer;
    (e) the free layer; and
    (f) a cap layer to give a seed layer/AFM layer/pinned layer/composite tunnel barrier layer/free layer/cap layer configuration.

10. The MTJ of claim 9 wherein the pinned layer has a CoFe/Ru/CoFeB/Co configuration in which the CoFe layer contacts the AFM layer and the Co layer interfaces with the CoMgO tunnel barrier layer.

11. The MTJ of claim 9 wherein the CoMgO layer has a thickness between about 4.5 and 6 Angstroms and the MgO layer has a thickness from about 8 to 12 Angstroms.

12. The MTJ of claim 9 wherein a ratio of Co:Mg in the CoMgO layer is from about 2:8 to 4:6.

* * * * *